(12) United States Patent
Van Brocklin et al.

(10) Patent No.: US 8,789,932 B2
(45) Date of Patent: Jul. 29, 2014

(54) PRINTHEAD AND RELATED METHODS AND SYSTEMS

(75) Inventors: Andrew L. Van Brocklin, Corvallis, OR (US); Eric L. Nikkel, Philomath, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 4 days.

(21) Appl. No.: 13/695,780

(22) PCT Filed: May 27, 2010

(86) PCT No.: PCT/US2010/036431
§ 371 (c)(1),
(2), (4) Date: Nov. 2, 2012

(87) PCT Pub. No.: WO2011/149469
PCT Pub. Date: Dec. 1, 2011

(65) Prior Publication Data
US 2013/0106961 A1 May 2, 2013

(51) Int. Cl.
*B41J 2/045* (2006.01)
*H01L 21/02* (2006.01)
*B41J 2/16* (2006.01)
*B41J 2/14* (2006.01)

(52) U.S. Cl.
CPC .... *B41J 2/04581* (2013.01); *B41J 2002/14467* (2013.01); *B41J 2/14233* (2013.01); *H01L 21/02038* (2013.01); *B41J 2/1626* (2013.01); *B41J 2/161* (2013.01)
USPC .................... 347/71; 347/68; 347/70; 347/72

(58) Field of Classification Search
USPC .................................... 347/68–72
See application file for complete search history.

(56) References Cited

U.S. PATENT DOCUMENTS

| 6,398,329 | B1 * | 6/2002 | Boyd et al. ........................ 347/7 |
| 6,491,385 | B2 | 12/2002 | Anagnostopoulos et al. |
| 6,739,199 | B1 * | 5/2004 | Nikkel ............................ 73/777 |

(Continued)

FOREIGN PATENT DOCUMENTS

| JP | 1998-319852 | 12/1998 |
| JP | 2000-261001 | 9/2000 |
| JP | 2001-179996 | 7/2001 |
| JP | 2001287362 | 10/2001 |

(Continued)

OTHER PUBLICATIONS

Donald Allred; Offset Class Inkjet Printing From Eastman Kodak Company; http://www.imieurope.com/imimages/i_Lisbon08/Allred%20-%20Kodak.pdf.

*Primary Examiner* — Henok Legesse
(74) *Attorney, Agent, or Firm* — Nathan R. Rieth (57) ABSTRACT

A printhead includes a moveable membrane, a piezoelectric actuator to move the membrane, and electronic circuitry disposed on the moveable membrane. A method of fabricating a printhead includes fabricating CMOS circuitry on a first side of a circuit wafer, and forming a chamber in a second side of the circuit wafer such that a bottom of the chamber forms a moveable membrane and the CMOS circuitry is disposed on the moveable membrane opposite the bottom of the chamber. A printing system includes a printhead having CMOS circuitry formed on a first side of a moveable membrane, a chamber having a bottom comprising a second side of the moveable membrane, and a piezoelectric actuator formed over the CMOS circuitry, configured to cause displacement of the moveable membrane into the chamber.

7 Claims, 5 Drawing Sheets

(56) References Cited

U.S. PATENT DOCUMENTS

| | | |
|---|---|---|
| 6,955,419 B2 * | 10/2005 | Andrews et al. ............... 347/70 |
| 7,004,563 B2 | 2/2006 | Silverbrook |
| 7,234,795 B2 | 6/2007 | Silverbrook |
| 7,404,633 B2 | 7/2008 | Silverbrook |
| 2003/0117041 A1 | 6/2003 | Kurihara et al. |
| 2008/0192091 A1 * | 8/2008 | Silverbrook et al. .......... 347/59 |
| 2008/0316263 A1 | 12/2008 | Silverbrook |

FOREIGN PATENT DOCUMENTS

| | | |
|---|---|---|
| JP | 2003285438 | 10/2003 |
| JP | 2004-271527 | 9/2004 |
| JP | 2006-041049 | 2/2006 |
| JP | 2006-051815 | 2/2006 |
| JP | 2006-069151 | 3/2006 |
| JP | 2008-517780 | 5/2008 |
| TW | 283890 | 7/2007 |

* cited by examiner

PRINTHEAD AND RELATED METHODS AND SYSTEMS

BACKGROUND

Drop-on-demand inkjet printers are commonly categorized according to one of two mechanisms of drop formation within an inkjet printhead. Thermal bubble inkjet printers use thermal inkjet printheads with heating element actuators that vaporize ink (or other fluid) inside ink-filled chambers to create bubbles that force ink droplets out of the printhead nozzles. Piezoelectric inkjet printers use piezoelectric inkjet printheads with piezoelectric material actuators that generate pressure pulses inside ink-filled chambers to force droplets of ink (or other fluid) out of the printhead nozzles.

Piezoelectric inkjet printheads are favored over thermal inkjet printheads when using jetable fluids whose higher viscosity and/or chemical composition prohibit the use of thermal inkjet printheads, such as UV curable printing inks. Thermal inkjet printheads are limited to jetable fluids whose formulations can withstand boiling temperature without experiencing mechanical or chemical degradation. Because piezo printheads use pressure (not heat) to force ink droplets out of nozzles, piezo printheads can accommodate a wider selection of jetable materials. Accordingly, piezo printheads are utilized widely to print on a variety of media substrates.

However, one problem associated with piezoelectric printheads is the construction of the MEMS (microelectromechanical systems) and piezo-actuator drive circuitry in a manner that minimizes the printing system cost. There are certain features of piezoelectric printheads that require electronic circuit control on a per-nozzle basis. For example, trimming individual nozzles and reducing crosstalk between adjacent nozzles requires the use of separate electronic circuitry for each nozzle. However, implementing the per-nozzle electronic circuitry requires additional area in the printhead which increases the printhead cost. Thus, constructing piezoelectric printheads that have a high nozzle density and a low cost is an ongoing challenge.

BRIEF DESCRIPTION OF THE DRAWINGS

The present embodiments will now be described, by way of example, with reference to the accompanying drawings, in which.

DETAILED DESCRIPTION

Overview of Problem and Solution

As noted above, one ongoing challenge associated with piezoelectric inkjet printheads is constructing the printheads with a high nozzle density and a low cost. The difficulty is primarily related to the scarcity of space available on the printhead for accommodating the separate electronic circuitry used to control each nozzle individually.

Embodiments of the present disclosure address this challenge, generally through a piezoelectric inkjet printhead that has CMOS circuitry fabricated on the moveable membrane used in actuation of the printhead. Having at least some of the CMOS circuit devices formed on the portion of the wafer surface that is deformed by actuation of the drop ejection MEMS (microelectromechanical systems) mechanism is a more efficient use of the available area within the printhead and reduces the complexity of the MEMS fabrication. Fabricating the CMOS circuitry and bonding it in wafer form to one or more additional wafers used to complete the MEMS structure also reduces the cost of interconnection between the piezo-actuators and the CMOS circuitry.

In one example embodiment, a printhead includes a moveable membrane, a piezoelectric actuator to move the membrane, and electronic circuitry disposed on the moveable membrane. In another embodiment, a printing system includes a printhead having CMOS circuitry formed on a first side of a moveable membrane. A chamber has a bottom that comprises the second side of the moveable membrane. A piezoelectric actuator configured to cause displacement of the moveable membrane into the chamber is formed over the CMOS circuitry.

In another embodiment, a method of fabricating an inkjet printhead includes fabricating CMOS circuitry on a first side of a circuit wafer. A chamber is formed in the second side of the circuit wafer such that the bottom of the chamber forms a moveable membrane. The CMOS circuitry fabricated on the first side of the circuit wafer is on the moveable membrane, and opposite to the bottom of the chamber that is formed in the second side of the circuit wafer.

Illustrative Embodiments

Figure 1:
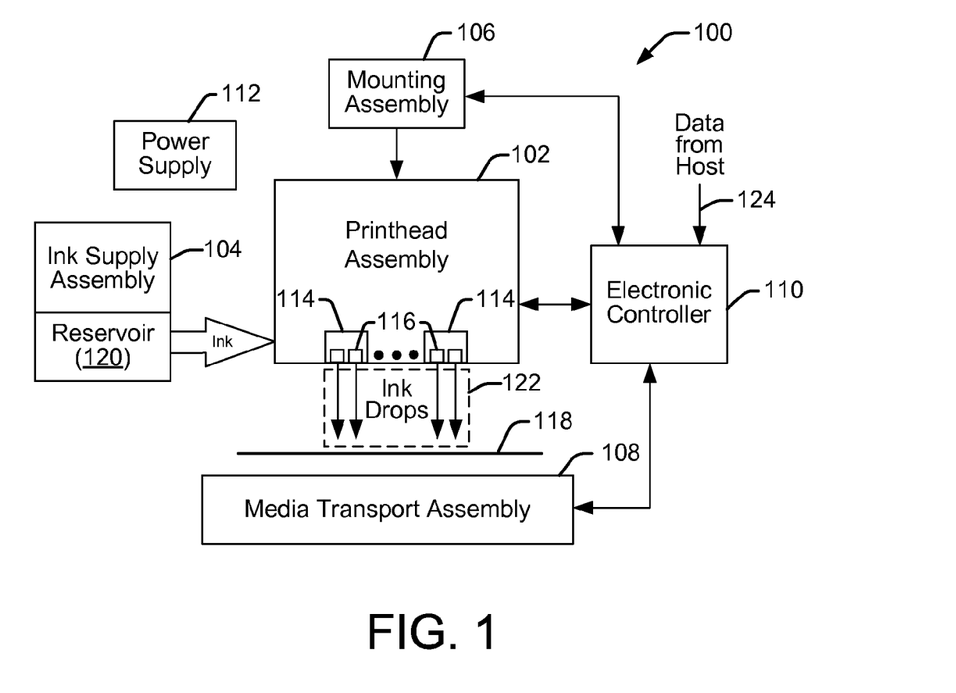
FIG. 1 illustrates an inkjet printing system suitable for incorporating a printhead, according to an embodiment.

FIG. 1 illustrates an inkjet printing system 100 suitable for incorporating a printhead or fluid ejection device as disclosed herein, according to an embodiment. In this embodiment, the printhead is disclosed as a fluid drop jetting printhead 114. Inkjet printing system 100 includes an inkjet printhead assembly 102, an ink supply assembly 104, a mounting assembly 106, a media transport assembly 108, an electronic controller 110, and at least one power supply 112 that provides power to the various electrical components of inkjet printing system 100. Inkjet printhead assembly 102 includes at least one printhead (fluid ejection device) or printhead die 114 that ejects drops of ink through a plurality of orifices or nozzles 116 toward a print medium 118 so as to print onto print medium 118. Print medium 118 is any type of suitable sheet material, such as paper, card stock, transparencies, Mylar, and the like. Typically, nozzles 116 are arranged in one or more columns or arrays such that properly sequenced ejection of ink from nozzles 116 causes characters, symbols, and/or other graphics or images to be printed upon print medium 118 as inkjet printhead assembly 102 and print medium 118 are moved relative to each other.

Ink supply assembly 104 supplies fluid ink to printhead assembly 102 and includes a reservoir 120 for storing ink. Ink flows from reservoir 120 to inkjet printhead assembly 102. Ink supply assembly 104 and inkjet printhead assembly 102 can form either a one-way ink delivery system or a recirculating ink delivery system. In a one-way ink delivery system, substantially all of the ink supplied to inkjet printhead assembly 102 is consumed during printing. In a recirculating ink delivery system, however, only a portion of the ink supplied to printhead assembly 102 is consumed during printing. Ink not consumed during printing is returned to ink supply assembly 104.

In one embodiment, inkjet printhead assembly 102 and ink supply assembly 104 are housed together in an inkjet cartridge or pen. In another embodiment, ink supply assembly 104 is separate from inkjet printhead assembly 102 and supplies ink to inkjet printhead assembly 102 through an interface connection, such as a supply tube. In either embodiment, reservoir 120 of ink supply assembly 104 may be removed, replaced, and/or refilled. In one embodiment, where inkjet printhead assembly 102 and ink supply assembly 104 are housed together in an inkjet cartridge, reservoir 120 includes a local reservoir located within the cartridge as well as a larger reservoir located separately from the cartridge. The separate, larger reservoir serves to refill the local reservoir. Accordingly, the separate, larger reservoir and/or the local reservoir may be removed, replaced, and/or refilled.

Mounting assembly 106 positions inkjet printhead assembly 102 relative to media transport assembly 108, and media transport assembly 108 positions print medium 118 relative to inkjet printhead assembly 102. Thus, a print zone 122 is defined adjacent to nozzles 116 in an area between inkjet printhead assembly 102 and print medium 118. In one embodiment, inkjet printhead assembly 102 is a scanning type printhead assembly. In a scanning type printhead assembly, mounting assembly 106 includes a carriage for moving inkjet printhead assembly 102 relative to media transport assembly 108 to scan print medium 118. In another embodiment, inkjet printhead assembly 102 is a non-scanning type printhead assembly. In a non-scanning printhead assembly, mounting assembly 106 fixes inkjet printhead assembly 102 at a prescribed position relative to media transport assembly 108. Thus, media transport assembly 108 positions print medium 118 relative to inkjet printhead assembly 102.

Electronic controller or printer controller 110 typically includes a processor, firmware, and other printer electronics for communicating with and controlling inkjet printhead assembly 102, mounting assembly 106, and media transport assembly 108. Electronic controller 110 receives data 124 from a host system, such as a computer, and includes memory for temporarily storing data 124. Typically, data 124 is sent to inkjet printing system 100 along an electronic, infrared, optical, or other information transfer path. Data 124 represents, for example, a document and/or file to be printed. As such, data 124 forms a print job for inkjet printing system 100 and includes one or more print job commands and/or command parameters.

In one embodiment, electronic controller 110 controls inkjet printhead assembly 102 for ejection of ink drops from nozzles 116. Thus, electronic controller 110 defines a pattern of ejected ink drops which form characters, symbols, and/or other graphics or images on print medium 118. The pattern of ejected ink drops is determined by the print job commands and/or command parameters.

In one embodiment, inkjet printhead assembly 102 includes one printhead 114. In another embodiment, inkjet printhead assembly 102 is a wide-array or multi-head printhead assembly. In one wide-array embodiment, inkjet printhead assembly 102 includes a carrier which carries printhead dies 114, provides electrical communication between printhead dies 114 and electronic controller 110, and provides fluidic communication between printhead dies 114 and ink supply assembly 104.

Figure 2:
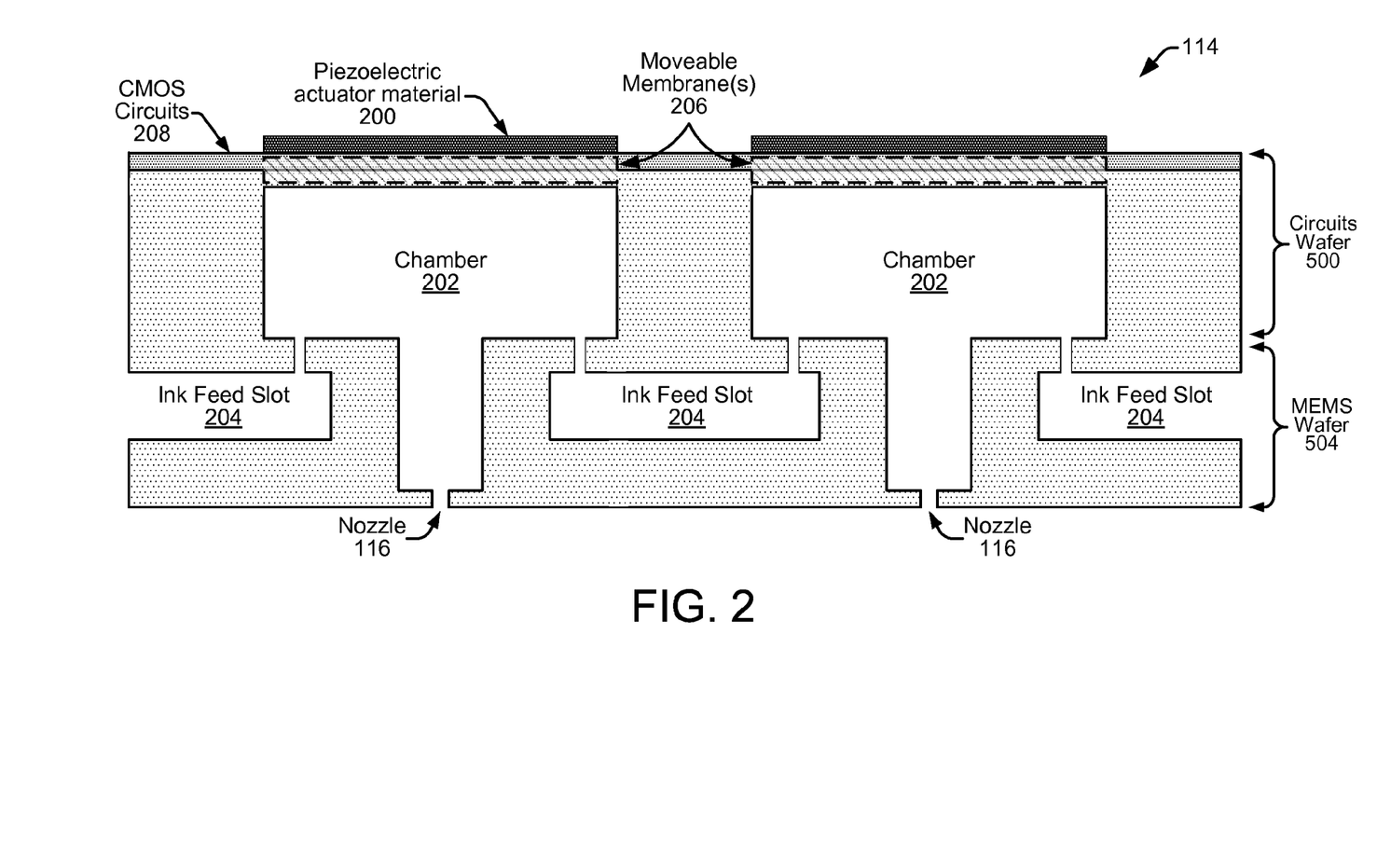
FIG. 2 illustrates a side view of a piezoelectric inkjet printhead with CMOS circuitry formed on a moveable membrane, according to an embodiment.

In one embodiment, inkjet printing system 100 is a drop-on-demand piezoelectric inkjet printing system wherein the printhead 114 is a piezoelectric inkjet printhead 114, such as shown in FIG. 2. FIG. 2 illustrates a partial side view of a piezoelectric inkjet printhead 114 with CMOS circuitry formed on a moveable membrane, according to an embodiment. The piezoelectric printhead 114 is formed as a wafer stack 506 that generally includes a silicon circuits wafer 500 and a silicon MEMS wafer 504, as discussed in greater detail below with reference to FIG. 5. The piezoelectric printhead 114 implements a piezoelectric ejection element/actuator 200 in an ink chamber 202 to generate pressure pulses that force ink or other fluid drops out of a nozzle 116. Ink is replaced in the chamber 200 through ink feed slots 204. Actuation of a piezo chamber 202 occurs when an actuation voltage signal is applied to the piezoelectric material 200 associated with the chamber.

Figure 3:
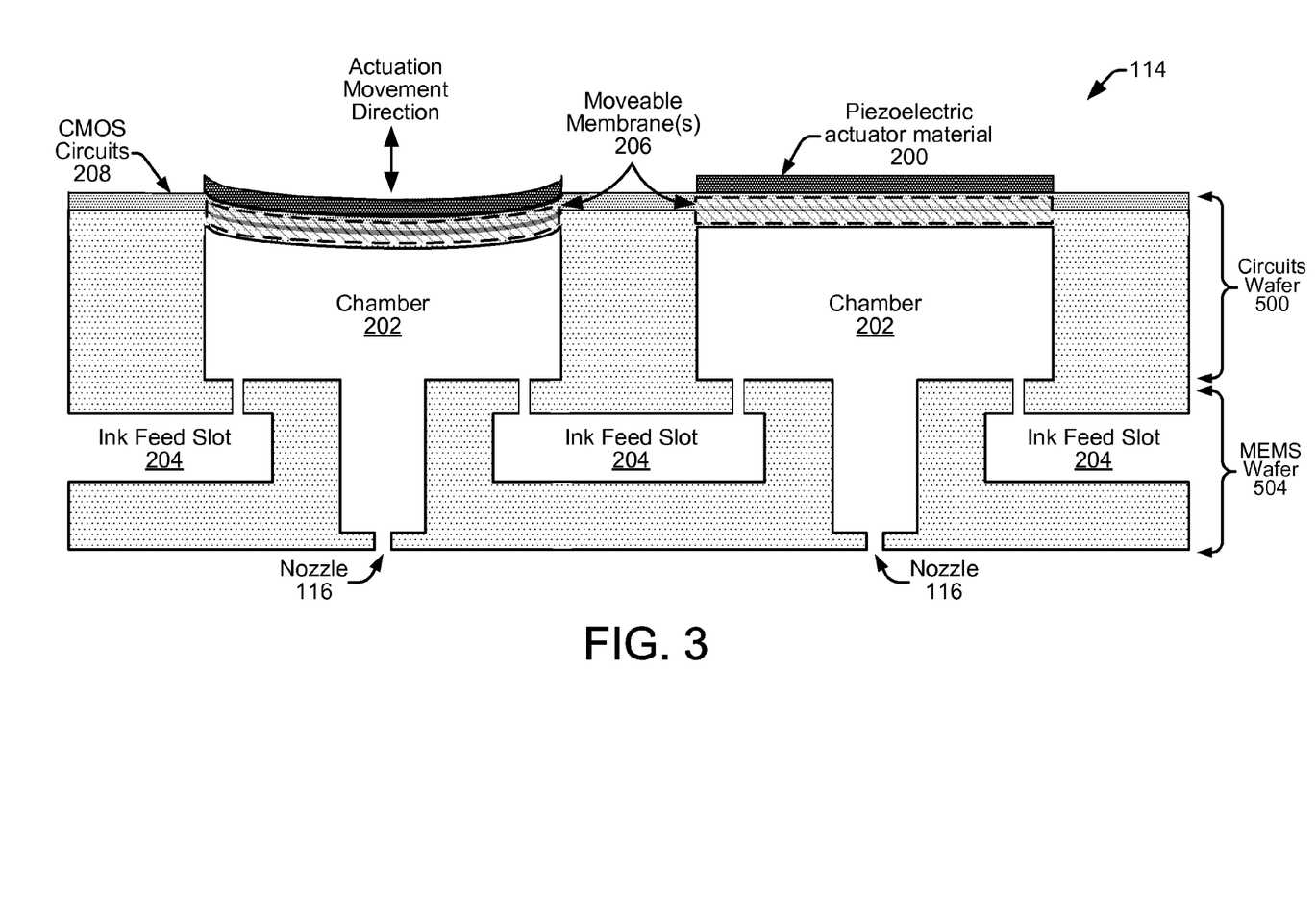
FIG. 3 illustrates the actuation of a piezoelectric printhead through application of an actuation voltage signal to piezoelectric material located above a respective chamber, according to an embodiment.

FIG. 3 illustrates the actuation of a piezo chamber 202 in piezoelectric printhead 114 through application of an actuation voltage signal to the piezoelectric material 200 located above the respective chamber 202, according to an embodiment. The piezo printhead 114 includes a moveable membrane 206 formed as the bottom portion of each chamber 202. Piezoelectric material 200 is joined (e.g., adhered or formed) to the moveable membrane 206. Actuation of the piezoelectric material 200 causes the material 200 to deform in the direction of the chamber 202 which results in a corresponding displacement of the adjoining moveable membrane 206 into the chamber 202 (the deformation and displacement are exaggerated in the FIG. 3 illustration for the purpose of this description). Displacement of the moveable membrane 206 into the chamber 202 reduces the chamber volume, causing the ejection of a drop of ink (or other fluid) from the chamber 202 through the nozzle 116.

Figure 5:
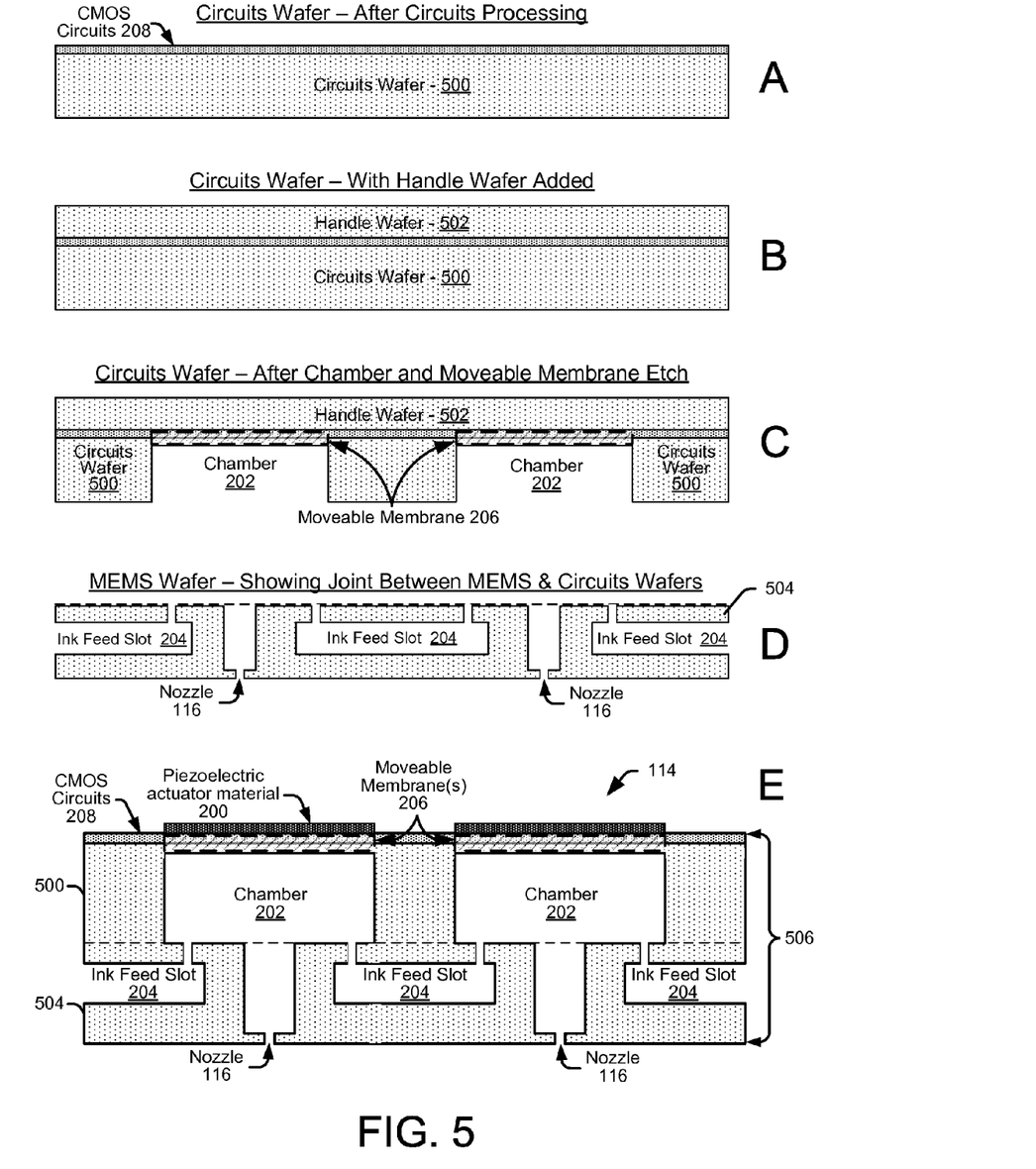
FIG. 5 illustrates general processing steps performed on the wafer stack for fabricating a piezoelectric printhead, according to an embodiment.

Referring to FIGS. 2 and 3, the piezoelectric printhead 114 also includes electronic CMOS circuitry 208 fabricated on the surface area of the circuits wafer 500 (FIG. 5). The CMOS circuitry 208 is constructed through standard CMOS fabrication processes and can be formed across the whole surface area of the top side of the circuits wafer 500, including on the moveable membrane 206. Thus, the moveable membrane 206 that flexibly deforms upon actuation of piezo material 200 to cause the ejection of ink droplets, serves on one side as the bottom surface of chamber 202 and on the other side as valuable silicon real estate for constructing the CMOS circuitry 208. Accordingly, as shown in FIG. 3, the portion of CMOS circuitry 208 fabricated on the moveable membrane 206 moves with the moveable membrane 206 as it flexibly deforms during actuation of the piezoelectric material 200.

Figure 4:
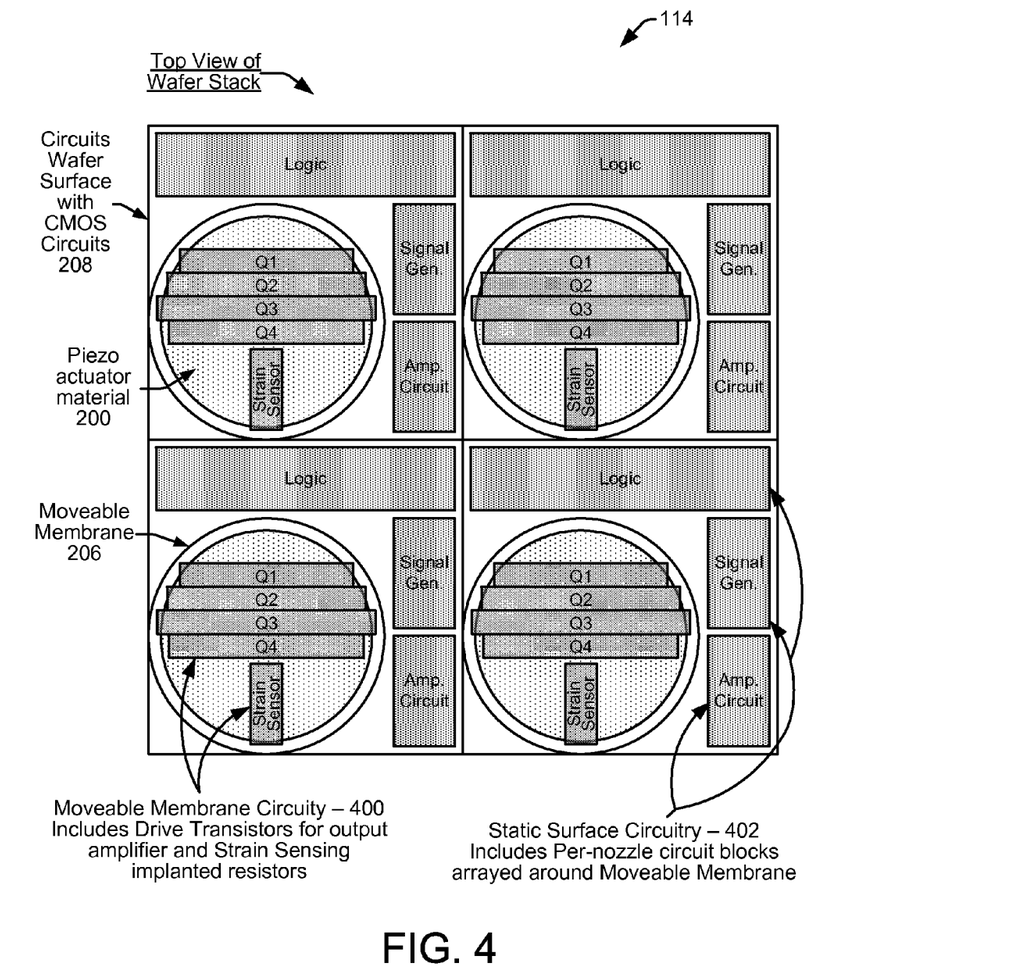
FIG. 4 illustrates a top down view of a piezoelectric printhead wafer stack, according to an embodiment.

FIG. 4 illustrates a top down view of the piezoelectric printhead 114 silicon wafer stack, according to an embodiment. The CMOS circuitry 208 includes both moveable membrane circuitry 400 and static surface circuity 402. The moveable membrane circuitry 400 fabricated on top of the moveable membrane 206 includes, for example, drive transistors Q1-Q4 for the amplifier circuitry, configured to drive the piezoelectric actuator material 200. Circuitry 400 on the moveable membrane 206 can also include a strain sensor implanted resistor.

During operation, the membrane 206 movement up and down relative to the plane of the circuits wafer 500 surface causes a strain in the crystal lattice of the silicon. The effect is to modify mobility carriers in the semiconductor. For the strain sensor resistor, the effect is a change in the resistance of the device. For MOS transistors (e.g., Q1-Q4), the effect is to impact the saturation current of the devices for a given gate voltage (Vgs), effectively making them narrower or wider depending on their orientation and the direction of the lattice strain. This effect is small however (less that 6%), and calculated values show lattice strains of 0.032 to 0.054. These values are acceptable for high precision and/or high speed circuitry, and they are more than sufficient in the present implementation for the output drive transistors used in the final stages of driving the piezoelectric actuator 200.

The strain sensor implanted resistor can be implemented as a conventional set of resistors formed from implant doping into the silicon surface of the moveable membrane 206. Such resistors have a high ohms/square resistivity, and through implantation they are fully mechanically coupled to the silicon surface/substrate. Four resistors are used in a conventional full bridge configuration. Mechanically, the resistors are arranged such that two are along the strain direction and two are orthogonal to it. Thus, the strain signal can be directly measured off the movement of the membrane 206. The strain signal can be used, for example, to feedback the position of the membrane 206 for control purposes.

The static surface circuitry 402 includes per-nozzle circuit blocks that are located in stationary locations on the surface of the circuits wafer 500 (FIG. 5) around the moveable membrane 206. The circuit blocks include a logic block, a signal generator block and an amplifier circuit block. Together, these circuit blocks serve as demultiplexing and power output circuits driving the piezoelectric actuator 200.

FIG. 5 illustrates general processing steps performed on the wafer stack in the fabrication of a piezoelectric printhead 114, according to an embodiment. The processing steps are partitioned in FIG. 5 as steps A-E. In step A, a circuits wafer 500 is shown. The circuits wafer 500 is an SOI (silicon on insulator) wafer that is processed to fully functional CMOS circuitry. The circuits wafer 500 includes the CMOS circuitry 208 implanted within and formed on top of the SOI wafer. The steps involved in fabricating CMOS circuitry 208 on circuits wafer 500 are standard CMOS fabrication processes that are well known to those skilled in the art.

In step B, a handle wafer is added/adhered (e.g., by a thermally releasable adhesive) to the circuits wafer 500. The handle wafer 502 is temporarily attached during processing for mechanical reasons. For example, the handle wafer 502 allows tooling machinery to grip the wafer assembly during processing without damaging the CMOS circuitry 208. The handle wafer 502 also provides mechanical strength during subsequent processing (e.g., etching) steps.

In step C of FIG. 5, chambers 202 and moveable membranes 206 are formed in the circuits wafer 500. Chambers 202 are etched into the SOI circuits wafer 500 to a depth that defines the thickness of moveable membranes 206 (i.e., diaphragms). In this step, the depth of the etch is typically controlled by an etch stop within the SOI circuits wafer 500, such as a silicon dioxide layer. The etch stop provides a mechanism for achieving an accurate thickness for the moveable membranes 206.

In step D of FIG. 5, a silicon based MEMS (microelectromechanical systems) wafer 504 is shown. The MEMS wafer 504 is processed to include nozzles 116 and ink feed slots 204. The MEMS wafer 504 has no electrical function, in contrast to the circuits wafer 500. Rather, the MEMS wafer 504 provides a fluid-mechanical function enabling ink or other fluids to flow through the piezoelectric printhead 114. Like the circuits wafer 500, the MEMS wafer 504 is typically an SOI wafer having one or more etch stops to provide etch accuracies when forming nozzles 116 and ink feed slots 204. The steps involved in fabricating MEMS wafer 504 are standard MEMS fabrication processes that are well known to those skilled in the art. The fundamental MEMS fabrication process steps include, for example, deposition of material layers (e.g., physical or chemical deposition), patterning the layers by photolithography, and etching (e.g., wet or dry etching) to produce the desired shapes in the wafer, such as nozzles 116 and ink feed slots 204. In step D, the joint between the circuits wafer 500 and the MEMS wafer 504 is also shown as a dotted line.

In step E, the full wafer stack 506 is shown. In this step, the circuits wafer 500 and MEMS wafer 504 are joined (dotted line) to one another by adhesion, for example, such that the chambers 202 and nozzles 116 are properly aligned. In step E, it is apparent that after the circuits wafer 500 and MEMS wafer 504 are joined, the handle wafer is removed from the circuit wafer 500. In step E, the piezoelectric actuator material 200 is also applied over the areas of the chamber moveable membranes 206. Accordingly, the CMOS circuitry 208 fabricated on the moveable membranes 206 is disposed under the piezoelectric material 200. The piezoelectric material 200 is made of PZT, for example, and is typically applied in a bulk approach whereby the PZT material is pre-formed and then adhered to the surface of the circuits wafer 500. The PZT can also be formed directly on top of the moveable membrane 206 area using a thin film approach. In the thin film approach, PZT is spun onto the circuits wafer 500 as a thin liquid coating and then processed in a furnace. It is noted that the thin film approach for applying PZT to the moveable membranes 206 of the circuits wafer 500 approaches industry standard limits for the time that CMOS circuits can withstand high temperatures without incurring damage. However, the thin film approach may be more suitable for the application of piezoelectric materials 200 other than PZT.

What is claimed is:

1. A printhead comprising:
    a moveable membrane;
    a piezoelectric actuator to move the membrane;
    active electronic circuitry disposed on the moveable membrane, and
    wherein the active electronic circuitry is disposed between the piezoelectric actuator and the membrane, and wherein the active electronic circuitry comprises output drivers to drive the piezoelectric actuator and a sensor configured to sense movement of the membrane.

2. A printhead as in claim 1, wherein the moveable membrane is a moveable portion of a circuit wafer, the printhead further comprising:
    electronic circuitry disposed on a static portion of the circuit wafer.

3. A printhead as recited in claim 2, wherein the circuit wafer comprises a SOI (silicon on insulator) wafer.

4. A printhead as in claim 1, wherein the sensor is a strain gauge resistor configured to indicate strain in the crystal lattice of silicon through a change in resistance.

5. A printing system comprising:
    printhead having CMOS circuitry formed on a first side of a moveable membrane;
    a chamber having a bottom comprising a second side of the moveable membrane;
    a piezoelectric actuator formed over the CMOS circuitry and configured to cause displacement of the moveable membrane into the chamber, and
    wherein the movable membrane is a movable portion of a circuit wafer, and wherein the CMOS circuitry comprises output drivers to drive the piezoelectric actuator and a sensor configured to sense movement of the membrane.

6. A system as in claim 5, wherein the chamber and moveable membrane are formed in a circuit wafer, the system further comprising:
    a nozzle formed in a MEMS (microelectromechanical systems) wafer;

wherein the circuit wafer and MEMS wafer are joined to provide alignment and fluid communication between the chamber and the nozzle.

7. A printhead as in claim 5, the printhead further comprising:
CMOS circuitry is disposed on a static portion of the circuit wafer.

\* \* \* \* \*

UNITED STATES PATENT AND TRADEMARK OFFICE
CERTIFICATE OF CORRECTION

PATENT NO. : 8,789,932 B2  
APPLICATION NO. : 13/695780  
DATED : July 29, 2014  
INVENTOR(S) : Andrew L. Van Brocklin et al.

Page 1 of 1

It is certified that error appears in the above-identified patent and that said Letters Patent is hereby corrected as shown below:

In the Claims

In column 6, line 51, in Claim 5, before "'printhead" insert -- a --.

In column 6, line 66, in Claim 6, delete "(microclectromechanical" and insert -- (microelectromechanical --, therefor.

Signed and Sealed this
Fourteenth Day of April, 2015

Michelle K. Lee
*Director of the United States Patent and Trademark Office*